United States Patent
Bruel

(10) Patent No.: US 9,048,288 B2
(45) Date of Patent: Jun. 2, 2015

(54) METHOD FOR TREATING A PART MADE FROM A DECOMPOSABLE SEMICONDUCTOR MATERIAL

(75) Inventor: Michel Bruel, Veurey Voroize (FR)

(73) Assignee: SOITEC, Bernin (FR)

( * ) Notice: Subject to any disclaimer, the term of this patent is extended or adjusted under 35 U.S.C. 154(b) by 541 days.

(21) Appl. No.: 13/111,748

(22) Filed: May 19, 2011

(65) Prior Publication Data

US 2011/0315664 A1   Dec. 29, 2011

(30) Foreign Application Priority Data

Jun. 23, 2010  (FR) ..................................... 10 55002

(51) Int. Cl.
- H01L 21/30 (2006.01)
- H01L 21/322 (2006.01)
- H01L 21/302 (2006.01)
- H01L 21/762 (2006.01)

(52) U.S. Cl.
CPC ................. H01L 21/76254 (2013.01)

(58) Field of Classification Search
CPC ..................... H01I 21/76254; H01L 21/76254
USPC ........................................... 438/458, 455, 459
See application file for complete search history.

(56) References Cited

U.S. PATENT DOCUMENTS

| | | | |
|---|---|---|---|
| 5,374,564 A * | 12/1994 | Bruel | 438/455 |
| 5,994,207 A * | 11/1999 | Henley et al. | 438/515 |
| 6,225,192 B1 * | 5/2001 | Aspar et al. | 438/460 |
| 6,287,941 B1 * | 9/2001 | Kang et al. | 438/459 |
| 6,355,541 B1 * | 3/2002 | Holland et al. | 438/459 |
| 6,387,829 B1 | 5/2002 | Usenko et al. | 438/977 |
| 6,632,482 B1 * | 10/2003 | Sheng | 427/523 |
| 6,794,276 B2 * | 9/2004 | Letertre et al. | 438/506 |
| 6,809,009 B2 * | 10/2004 | Aspar et al. | 438/459 |
| 6,809,044 B1 * | 10/2004 | Aspar et al. | 438/120 |
| 6,913,971 B2 * | 7/2005 | Aspar et al. | 438/256 |
| 6,964,914 B2 * | 11/2005 | Ghyselen et al. | 438/458 |
| 6,979,630 B2 * | 12/2005 | Walitzki | 438/459 |
| 6,995,075 B1 * | 2/2006 | Usenko | 438/458 |

(Continued)

FOREIGN PATENT DOCUMENTS

EP   0 858 110 A1   8/1998
EP   0 924 769 A1   6/1999

(Continued)

OTHER PUBLICATIONS

French Search Report, FR 1055002, mailed Oct. 5, 2010.

*Primary Examiner* — Mary Wilczewski
(74) *Attorney, Agent, or Firm* — TraskBritt

(57) ABSTRACT

The present disclosure provides methods for treating a part made from a decomposable semiconductor material, and particularly, methods for detaching a surface film from the rest of such part. According to the provided methods, a burst or pulse of light particles of short duration and very high intensity is applied to the part in order to selectively heat, under substantially adiabatic conditions, an area of the part located at a predefined depth from the surface to a temperature higher than the decomposition temperature of the material, and subsequently a surface film is detached from the rest of the part at the heated area. In preferred embodiments, the decomposable semiconductor material comprises Ga, or comprises $Al_xGa_yIn_{1-x-y}N$, where $0 \leq x \leq 1$, $0 \leq y \leq 1$ and $x+y \leq 1$.

14 Claims, 2 Drawing Sheets

(56) References Cited

U.S. PATENT DOCUMENTS

| | | | |
|---|---|---|---|
| 6,995,430 B2* | 2/2006 | Langdo et al. | 257/352 |
| 7,008,859 B2* | 3/2006 | Letertre et al. | 438/459 |
| 7,011,707 B2* | 3/2006 | Nagai et al. | 117/94 |
| 7,067,396 B2* | 6/2006 | Aspar et al. | 438/459 |
| 7,112,243 B2* | 9/2006 | Koike et al. | 117/88 |
| 7,148,124 B1* | 12/2006 | Usenko | 438/458 |
| 7,199,401 B2* | 4/2007 | Tazima et al. | 257/99 |
| 7,259,388 B2* | 8/2007 | Langdo et al. | 257/18 |
| 7,282,381 B2* | 10/2007 | Feltin et al. | 438/46 |
| 7,297,612 B2* | 11/2007 | Langdo et al. | 438/458 |
| 7,332,030 B2* | 2/2008 | Bruel | 117/91 |
| 7,449,394 B2* | 11/2008 | Akatsu et al. | 438/458 |
| 7,498,234 B2* | 3/2009 | Aspar et al. | 438/455 |
| 7,498,245 B2* | 3/2009 | Aspar et al. | 438/514 |
| 7,575,988 B2* | 8/2009 | Bourdelle et al. | 438/518 |
| 7,588,994 B2* | 9/2009 | Langdo et al. | 438/406 |
| 7,615,468 B2* | 11/2009 | Boussagol et al. | 438/459 |
| 7,670,930 B2* | 3/2010 | Tauzin et al. | 438/458 |
| 7,772,087 B2* | 8/2010 | Nguyen et al. | 438/458 |
| 7,772,088 B2* | 8/2010 | Henley et al. | 438/458 |
| 7,811,902 B2* | 10/2010 | Kim | 438/458 |
| 7,838,392 B2* | 11/2010 | Langdo et al. | 438/459 |
| 7,839,001 B2* | 11/2010 | Boussagol et al. | 257/782 |
| 7,883,994 B2* | 2/2011 | Moriceau et al. | 438/464 |
| 7,939,428 B2* | 5/2011 | Boussagol et al. | 438/459 |
| 7,943,485 B2* | 5/2011 | Francis et al. | 438/458 |
| 8,026,534 B2* | 9/2011 | Langdo et al. | 257/189 |
| 8,093,686 B2* | 1/2012 | Garnier | 257/615 |
| 8,101,503 B2* | 1/2012 | Aspar et al. | 438/459 |
| 8,124,499 B2* | 2/2012 | Henley et al. | 438/460 |
| 8,183,082 B1* | 5/2012 | Lewis et al. | 438/73 |
| 8,222,119 B2* | 7/2012 | Henley | 438/459 |
| 8,241,996 B2* | 8/2012 | Henley et al. | 438/458 |
| 8,252,663 B2* | 8/2012 | Fournel | 438/458 |
| 8,309,431 B2* | 11/2012 | Nguyen et al. | 438/458 |
| 8,470,712 B2* | 6/2013 | Moriceau et al. | 438/689 |
| 8,481,409 B2* | 7/2013 | Moriceau et al. | 438/459 |
| 8,557,679 B2* | 10/2013 | Chuang et al. | 438/458 |
| 8,679,946 B2* | 3/2014 | Moriceau et al. | 438/459 |
| 8,765,577 B2* | 7/2014 | Bedell et al. | 438/455 |
| 2002/0014407 A1* | 2/2002 | Allen et al. | 204/298.36 |
| 2003/0008475 A1* | 1/2003 | Cheung et al. | 438/455 |
| 2004/0248380 A1* | 12/2004 | Aulnette et al. | 438/459 |
| 2004/0262686 A1* | 12/2004 | Shaheen et al. | 257/347 |
| 2005/0196937 A1* | 9/2005 | Daval et al. | 438/455 |
| 2005/0269671 A1* | 12/2005 | Faure et al. | 257/618 |
| 2006/0063353 A1* | 3/2006 | Akatsu | 438/455 |
| 2006/0079071 A1* | 4/2006 | Moriceau et al. | 438/459 |
| 2006/0189020 A1* | 8/2006 | Kim | 438/47 |
| 2006/0205180 A1* | 9/2006 | Henley et al. | 438/458 |
| 2007/0072396 A1* | 3/2007 | Feltin et al. | 438/478 |
| 2007/0176210 A1* | 8/2007 | Murphy et al. | 257/211 |
| 2008/0014714 A1* | 1/2008 | Bourdelle et al. | 438/455 |
| 2008/0064182 A1* | 3/2008 | Hebras | 438/455 |
| 2008/0303033 A1* | 12/2008 | Brandes | 257/76 |
| 2010/0025228 A1* | 2/2010 | Tauzin et al. | 204/192.11 |
| 2010/0244196 A1* | 9/2010 | Yoshida | 257/615 |
| 2011/0315664 A1* | 12/2011 | Bruel | 219/121.35 |
| 2013/0072009 A1* | 3/2013 | Bruel | 438/530 |

FOREIGN PATENT DOCUMENTS

| | | |
|---|---|---|
| EP | 2002474 A2 | 12/2008 |
| FR | 2 853 991 A1 | 10/2004 |
| FR | 2 910 179 A1 | 6/2008 |
| WO | WO 2007/110515 A2 | 10/2007 |

* cited by examiner

METHOD FOR TREATING A PART MADE FROM A DECOMPOSABLE SEMICONDUCTOR MATERIAL

CROSS-REFERENCE TO RELATED APPLICATION

This application claims the benefit under 35 U.S.C. §119 (e) to French Patent Application Serial No. FR 1055002, filed Jun. 23, 2010.

FIELD OF THE INVENTION

The present invention relates to methods for treating parts made from decomposable semiconductor materials, and particularly, to methods for detaching surface films from the rest of the part, and even more particularly, where the material has a composition $Al_xGa_yIn_{1-x-y}N$, where $0 \leq x \leq 1$, $0 \leq y \leq 1$ and $x+y \leq 1$.

BACKGROUND OF THE INVENTION

Semiconductors of the III-N type, that is, having the general formula $Al_xGa_yIn_{1-x-y}N$ where $0 \leq x \leq 1$, $0 \leq y \leq 1$ and $x+y \leq 1$, and, in particular, GaN, have features that make them highly attractive for the optoelectronic, power and radiofrequency applications. However, the development of these applications is hampered by technico-economic limits of $Al_xGa_yIn_{1-x-y}N$ substrates, which are not readily available.

III-N devices are, therefore, commonly fabricated on a substrate formed by the transfer to a support substrate of a thin film taken from a donor substrate of high-grade III-N material suitable for the intended application. The poor availability of $Al_xGa_yIn_{1-x-y}N$ substrates is thus offset by the possibility of using a donor substrate repeatedly.

The SMARTCUT® process is a well-known transfer technique, whereby, in general, a dose of atomic or ionic species is implanted in a donor substrate in order to create an embrittlement area therein at a predefined depth that bounds a thin surface film to be transferred. Then, the donor substrate is bonded to a support substrate, or recipient substrate, and is fractured at the embrittlement area, thereby allowing detachment of the thin surface film now bonded to the recipient substrate.

However, because fracturing substrates made from III-N material requires doses of atomic or ionic species, which are five to ten times higher than in silicon, such processes typically have substantially higher costs than similar processes in silicon.

It can be appreciated, therefore, that it would be advantageous to develop methods for detaching thin films from substrates made from III-N material that overcome these limitations of available processes, for example, being less costly.

SUMMARY OF THE INVENTION

In view of the above, the present invention provides processes for treating parts comprising a thermally decomposable material, which includes the steps of:
application of a pulse of particle flux on a surface of the part, the duration and intensity of the pulsed flux being selected in order to selectively heat an area of the part located at a predefined depth from the surface under substantially adiabatic conditions to a temperature higher than the decomposition temperature of the material; and
detaching a surface film from the rest of the part at the heated area.

According to other features of this method:
the thermally decomposable material includes Ga, and preferably includes a III-N compound such as $Al_xGa_yIn_{1-x-y}N$ where $0 \leq x \leq 1$, $0 \leq y \leq 1$ and $x+y \leq 1$;
the duration and intensity of the particle flux are selected so that the half-thickness of the energy deposition profile is less than the thermal diffusion length during the pulse duration, where the thermal diffusion length is preferably approximated as the square root of the pulse duration times the thermal diffusivity;
the pulse of particle flux has a duration between 10 nanoseconds and 10 microseconds and/or an intensity between $1 \times 10^6$ and $5 \times 10^7$ W/cm$^2$;
the part is at an initial temperature that is lower than the decomposition temperature of the material at the time of application of the particle flux, for example, at a temperature between 400° C. and 750° C.;
the flux includes light particles having an atomic number between about 1 and 3 and/or H or He in a neutral or an ionic form;
the particles are applied to a dose of between about $1 \times 10^{12}$ and $5 \times 10^{13}$ particles/cm$^2$;
the heated area is returned to an ambient temperature prior to detaching the film;
the part is assembled with a support in order to obtain a composite structure after applying the pulse of particle flux and prior to detaching a film; and
a mechanical or thermal stress or a combination thereof is applied to the composite structure after assembling in order to cause the detachment of a film from the rest of the part.

Additional features and advantages of the present invention will be described with reference to the drawings. In the description, reference is made to the accompanying figures that are meant to illustrate preferred embodiments of the invention. It is understood that such embodiments do not represent the full scope of the invention. Further aspects and details, and alternative combinations of the elements, of this invention that will be apparent from the following detailed description to one of ordinary skill in the art are also understood to be within the scope of this invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAILED DESCRIPTION

The present invention applies to parts made from compound semiconductor materials that are liable to decompose under the effect of an energy input, especially an energy input by a particle flux.

The term "compound material" is used herein to refer to material consisting of at least two types of atoms. Typically, these atoms are Group III atoms, e.g., gallium, aluminum, indium, etc., and the most preferred compound material has the composition $Al_xGa_yIn_{1-x-y}N$, where $0 \leq x \leq 1$, $0 \leq y \leq 1$ and $x+y \leq 1$. This material is typically formed by deposition on a growth support made from, e.g., sapphire.

The term "decomposition" is used herein to refer to a modification of the inherent structure of the material, which may, depending on the material, consist of a chemical transformation, a phase separation, an embrittlement, the creation of new phases, a localized fusion, etc.

The term "part" is used herein to refer not only to compound materials in the form of a wafer or other substrate that can be used in the electronic, optical or optoelectronic industry, but also to compound materials in other forms, e.g., an ingot, a ball, or any other shape, having at least one surface across which the particle flux can be applied. Preferably, the roughness amplitude of such a surface is significantly lower than the penetration depth of the particles.

Figure 1:
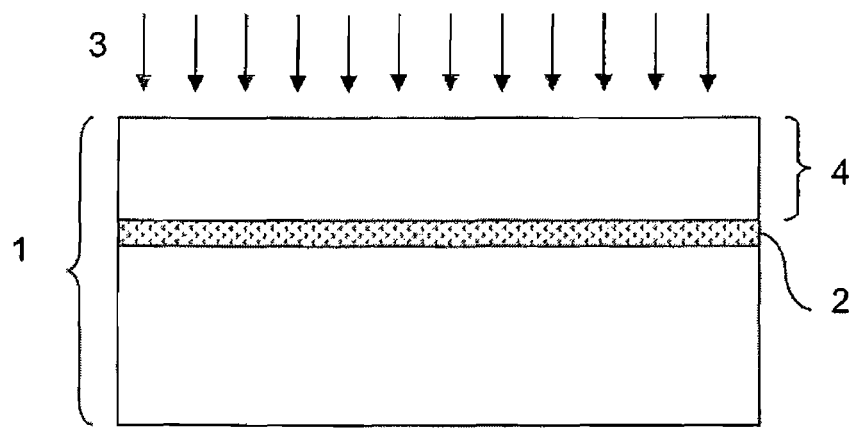
FIG. 1 illustrates a particle flux being applied to a part or substrate.

In the non-limiting, preferred embodiment described below with reference to FIGS. 1 and 2, the part 1 to be treated is considered to be a substrate made from a material having the preferred as $Al_xGa_yIn_{1-x-y}N$ where $0 \leq x \leq 1$, $0 \leq y \leq 1$ and $x+y \leq 1$. However, as stated above, the invention should be understood to also apply to parts present in forms other than substrates (for electronic or similar use) and to decomposable materials of other compositions.

According to the present invention, the part is treated by applying a particle flux 3 in the form of a burst of short duration and very high-intensity on the substrate 1. Such a short, high-intensity particle flux is also referred to herein as a "pulse." The pulse duration is preferably between about 10 nanoseconds and a few microseconds, for example, 10 ns. The power flux density is preferably between about $1 \times 10^6$ and a few $10^7$ W/cm$^2$.

Preferably, light particles having a low atomic number are selected, for example, having an atomic number of one, two or three, so that the energy deposited inside the material is, for the most part, extracted from the particle pulse by braking due to electron interactions and not by atomic collisions. The latter are undesirable because they might generate defects. Preferably, the particles 3 are selected from light, ionic (positively or negatively charged) or neutral particles, for example: H, H+, He, He+, their isotopes, H−, or electrons (either alone or combined together).

Figure 3:
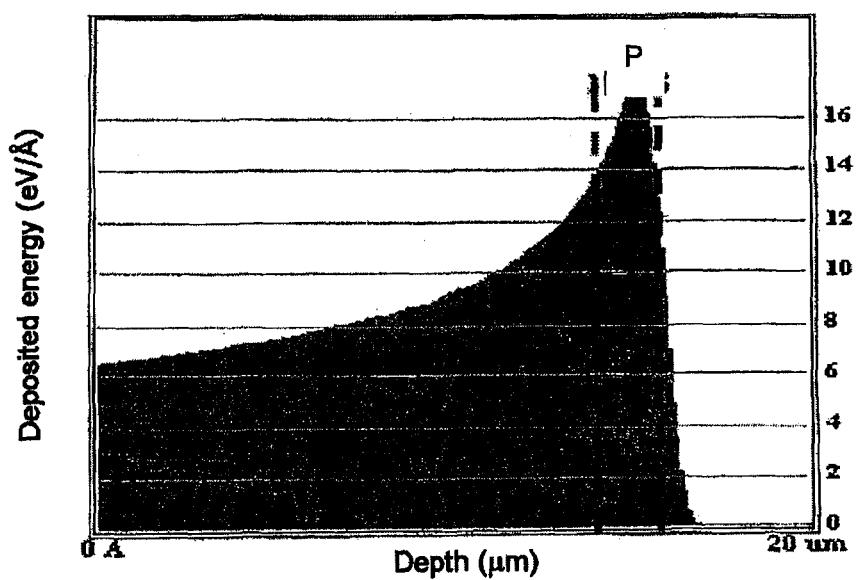
FIG. 3 illustrates an exemplary profile of energy deposited by the particle flux as a function of depth.

With this choice of the type of particles, and as shown in the graph in FIG. 3, the shape of the energy deposition profile generally displays an amplitude increasing from the surface of the substrate (depth: 0), toward a peak P at a depth approaching the target thickness. This peak is commensurately narrower, in general, as the particles have a lower atomic number and/or a higher energy.

If the flux burst is of sufficiently short duration, e.g., being in the above-mentioned duration range, the energy deposition can be considered as adiabatic, that is, practically without any heat transfer elsewhere than in the target area. In the absence of energy transfer from the target area, the temperature elevation profile generated by the flux in the substrate is similar to the energy deposition profile.

The adiabaticity criterion can be estimated rapidly by comparing the half-thickness of the energy deposition profile with the thermal diffusion length during the pulse duration, where the thermal diffusion length can be approximated as the square root of the pulse duration times the thermal diffusivity. If the half-thickness of the energy deposition profile is less than the thermal diffusion length during the pulse duration, then the adiabaticity criterion can be considered to be satisfied.

Consider an example where the half-thickness is 1 μm of the energy deposition profile, where the pulse duration is 400 ns, and where the thermal diffusivity is 0.1 cm$^2$/s. then the thermal diffusion length is:

$$\sqrt{100 \cdot 10^{-9} \cdot 0.1} = 10^{-4} \text{ cm} =$$

$$\sqrt{400 \cdot 10^{-9} \cdot 0.1} = 2 \cdot 10^{-4} \text{ cm} = 2 \text{ μm}$$

Since 1 μm<2 μm, the adiabaticity criterion can be considered to be satisfied for this example.

However, if the particle flux is not applied under adiabatic conditions, the temperature profile resulting from the energy deposition by the particles is less peaked and more spread out than the energy deposition profile.

It may be possible to reduce the particle flux density if the substrate is pre-heated prior to implantation to an initial temperature (also referred to as the "bottom temperature"), which is lower than the temperature at which the material starts to decompose. With such pre-heating, the ion beam is only required to provide the additional energy in the vicinity of the targeted area that is sufficient to raise the temperature from the initial temperature to at least the decomposition temperature.

It may also be possible to reduce the particle flux density where the profile of the energy peak stands out clearly, that is, typically with a ratio higher than 2 between the height of this peak and the surface energy level. This is typically the case with high-energy implantations.

The particle treatment can be carried out using machines producing particle beams that have a temporal steady-state intensity, that are highly focused, and that can be scanned at high speed on the surface of the substrate. With such beams, any one location experiences a pulse of particles depending on the beam size and scanning speed. Alternatively, particle beams can be used that are spatially uniform across the surface of the part but temporally pulsed.

Preferred equipment includes continuous focused beam machines and very high-power pulsed beam machines.

Figure 2:
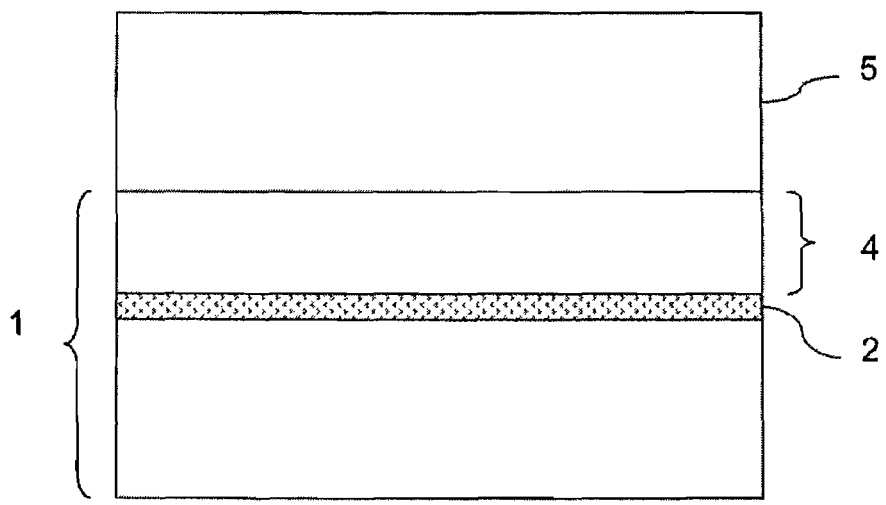
FIG. 2 illustrates assembly of the part on a support.

In further preferred embodiments illustrated in FIG. 2, a part 1 after such particle treatment can then be assembled on support substrate 5, which acts as a stiffener, and then a mechanical and/or thermal stress can be applied to this structure at the embrittled area 2. In this manner, a film 4 (see FIG. 1) can be transferred to the support substrate 5 by detachment at the embrittled area 2. Generally, only a low thermal budget suffices to cause the detachment of the film 4 from the rest of the support 1.

The methods of this invention find particular application when the material contains gallium, which has the particular feature of having a melting point lower than 50° C. In fact, after the application of a stiffener, a film can be detached after the heated area returns to ambient temperature, because the gallium liquid phase thereby created allows such a detachment, by the application of small mechanical forces and/or a slight heat treatment.

For example, suitable conditions for the bombardment of a GaN substrate by H+ ions are:
  initial temperature: about 750° C.,
  particle dose: about $2 \times 10^{12}$ particles/cm$^2$,
  particle energy: about 1.5 MeV,
  pulse duration: about 100 ns,
  energy deposition density: about 0.5 J/cm$^2$, and
  ion current density: about 3.5 A/cm$^2$.

In general, these conditions lead to an implanted dose during the treatment that is typically between a few $10^{12}$ and a few $10^{13}$ particles/cm$^{-2}$. It should be noted that this dose is much lower than that used to embrittle a silicon substrate for the application of a SMARTCUT® process, in which the usual dose is higher than $10^{16}$ particles/cm$^{-2}$.

The word "about" (and other words of approximation or degree) are used herein to mean within acceptable and expected limits, usually commercially acceptable limits and ranges. The limits and ranges signified by these terms depend on commercial requirements (or research requirements, or the like) and can vary, but in all cases are not to be construed as imposing requirements beyond what are currently achievable given a current state-of-the-art.

The preferred embodiments of the invention described above do not limit the scope of the invention, since these embodiments are illustrations of several preferred aspects of the invention. Any equivalent embodiments are intended to be within the scope of this invention. Indeed, various modifications of the invention, in addition to those shown and described herein, such as alternative useful combinations of the elements described, will become apparent to those skilled in the art from the subsequent description. Such modifications are also intended to fall within the scope of the appended claims. Headings and legends are used herein for clarity and convenience only.

What is claimed is:

1. A method for treating a part comprising a thermally decomposable material comprising $Al_xGa_yIn_{1-x-y}N$ where $0 \le x \le 1$, $0 \le y \le 1$ and $x+y \le 1$, which method comprises:
   applying a pulse of particle flux on a surface of the part, wherein the particle flux is a flux of atomic or ionic species, with the duration and intensity of the pulsed flux being selected in order to selectively heat an area of the part located at a predefined depth from the surface under substantially adiabatic conditions to a temperature higher than the decomposition temperature of the thermally decomposable material, and wherein the particles are applied to a dose of between about $1 \times 10^{12}$ and $5 \times 10^{13}$ particles/cm$^2$; and
   detaching a surface film from the rest of the part at the heated area.

2. The method of claim 1, wherein the duration and intensity of the particle flux are further selected so that the half-thickness of the part's energy deposition profile is less than a thermal diffusion length provided during the duration of the pulsed flux.

3. The method of claim 2, wherein the thermal diffusion length is approximated as the square root of the duration of the pulsed flux times a thermal diffusivity.

4. The method of claim 1, wherein the pulse has a duration between 10 nanoseconds and 10 microseconds.

5. The method of claim 1, wherein the particle flux has an intensity between $1 \times 10^6$ and $5 \times 10^7$ W/cm$^2$.

6. The method of claim 1, wherein, at the time of application of the particle flux, the part is at an initial temperature that is lower than the decomposition temperature of the thermally decomposable material.

7. The method of claim 6, wherein the initial temperature is between 400° C. and 750° C.

8. The method of claim 1, wherein the particle flux comprises H or He.

9. The method of claim 1, wherein the flux of atomic species comprises particles having an atomic number between about 1 and 3.

10. The method of claim 1, which further comprises, prior to detaching the film, returning the heated area to ambient temperature.

11. The method of claim 1, which further comprises, prior to detaching the film, assembling the part with a support in order to obtain a composite structure.

12. The method of claim 11, which further comprises, after assembling, applying a mechanical or thermal stress or a combination thereof to the composite structure in order to cause the detachment of a film from the rest of the part.

13. The method of claim 1, wherein the thermally decomposable material is a thermally decomposable semiconductor material.

14. A method for treating a part comprising a thermally decomposable semiconductor material comprising a III-N compound, which method comprises:
   providing a part including a continuous layer of III-N compound;
   applying a pulse of particle flux on a surface of the part, wherein the particle flux is a flux of atomic or ionic species, with the duration and intensity of the pulsed flux being selected in order to selectively heat an area of the part located at a predefined depth from the surface under substantially adiabatic conditions to a temperature higher than the decomposition temperature of the thermally decomposable material to form an intermediate decomposed layer within the layer of III-N compound separating a surface film of the layer of III-N compound located directly on one side of the intermediate decomposed layer from a remainder of the layer of III-N compound located directly on an opposite side of the intermediate decomposed layer at the intermediate decomposed layer, wherein the atomic or ionic species are applied to a dose of between about $1 \times 10^{12}$ and $5 \times 10^{13}$ particles/cm$^2$;
   assembling the part with a support in order to obtain a composite structure; and
   detaching the surface film of the layer of III-N compound from the remainder of the layer of III-N compound located directly on an opposite side of the intermediate decomposed layer at the intermediate decomposed layer to transfer the surface film of the layer of III-N compound to the support.

* * * * *